(12) United States Patent
Kim et al.

(10) Patent No.: US 7,129,174 B2
(45) Date of Patent: Oct. 31, 2006

(54) METHODS OF FABRICATING A SEMICONDUCTOR SUBSTRATE FOR REDUCING WAFER WARPAGE

(75) Inventors: Won-Jin Kim, Gyeonggi-do (KR); Young-Wook Park, Gyeonggi-do (KR); Jeong-Do Ryu, Gyeonggi-do (KR)

(73) Assignee: Samsung Electronics Co., Ltd. (KR)

( * ) Notice: Subject to any disclaimer, the term of this patent is extended or adjusted under 35 U.S.C. 154(b) by 15 days.

(21) Appl. No.: 10/806,521

(22) Filed: Mar. 23, 2004

(65) Prior Publication Data
US 2004/0241946 A1 Dec. 2, 2004

(30) Foreign Application Priority Data
Mar. 24, 2003 (KR) .................. 10-2003-0018275

(51) Int. Cl.
*H01L 21/302* (2006.01)
*H01L 21/461* (2006.01)
(52) U.S. Cl. .................. 438/692; 438/716; 438/748
(58) Field of Classification Search ............ 438/301, 438/172, 478, 127, 622, 257, 275, 692, 716, 438/748, 753
See application file for complete search history.

(56) References Cited
U.S. PATENT DOCUMENTS
6,090,708 A * 7/2000 Sandhu et al. ............. 438/683

6,861,359 B1 * 3/2005 Ota et al. .................. 438/692
2002/0132393 A1 9/2002 Kraxenberger et al. ..... 438/127

FOREIGN PATENT DOCUMENTS
JP 06-216064 8/1994
KR 1020000003235 1/2000
KR 1020010008576 2/2001

* cited by examiner

*Primary Examiner*—Walter L. Lindsay, Jr.
(74) *Attorney, Agent, or Firm*—Myers Bigel Sibley & Sajovec, PA (57) ABSTRACT

Methods of fabricating a semiconductor device can include forming at least one layer on a first and a second side of a semiconductor substrate. Portions of the at least one layer may be removed on the first side of the semiconductor substrate to form a pattern of the at least one layer on the first side of the substrate while the at least one layer is maintained on the second side of the substrate. A capping layer can be formed on the pattern of the at least one layer on the first side of the substrate and on the at least one layer on the second side of the semiconductor substrate. The capping layer can be removed on the second side of the semiconductor substrate, thereby exposing the at least one layer on the second side of the substrate while maintaining the capping layer on the first side of the substrate. The at least one layer can be removed on the second side of the semiconductor substrate, while the capping layer and the pattern of the at least one layer is maintained on the first side of the semiconductor substrate. A portion of the capping layer can be removed on the first side of the semiconductor substrate.

14 Claims, 9 Drawing Sheets

Fig. 1

(PRIOR ART)

Fig. 2

(PRIOR ART)

METHODS OF FABRICATING A SEMICONDUCTOR SUBSTRATE FOR REDUCING WAFER WARPAGE

RELATED APPLICATIONS

This application claims priority to Korean Patent Application No. 2003-18275, filed Mar. 24, 2003, in the Korean Intellectual Property Office, the disclosure of which is incorporated by reference herein in its entirety.

BACKGROUND OF THE INVENTION

1. Field of the Invention

The present invention relates generally to a semiconductor devices and, more specifically, to methods for fabricating semiconductor devices.

2. Description of Related Art

Generally, semiconductor devices are fabricated by forming a plurality of material layers on a semiconductor substrate and subsequently patterning the material layers. As used herein, the "front side" of the semiconductor substrate refers to the side of the semiconductor substrate on which semiconductor devices are formed and the "back side" refers to the opposite side of the substrate. As layers are being formed on the front side of the substrate, material layers similar to the front side material layers may be formed on the back side of the semiconductor substrate. The material layers can apply tensile stresses or compressive stresses to the semiconductor substrate. If material layers having the same components and thicknesses were formed on the front and back sides of the semiconductor substrate, then the semiconductor substrate may maintain its original shape because stresses on the front and back sides of the substrate are balanced. However, warpage of the semiconductor substrate may occur when the forces on the front and the back sides of the semiconductor substrate are not balanced.

Figure 1:
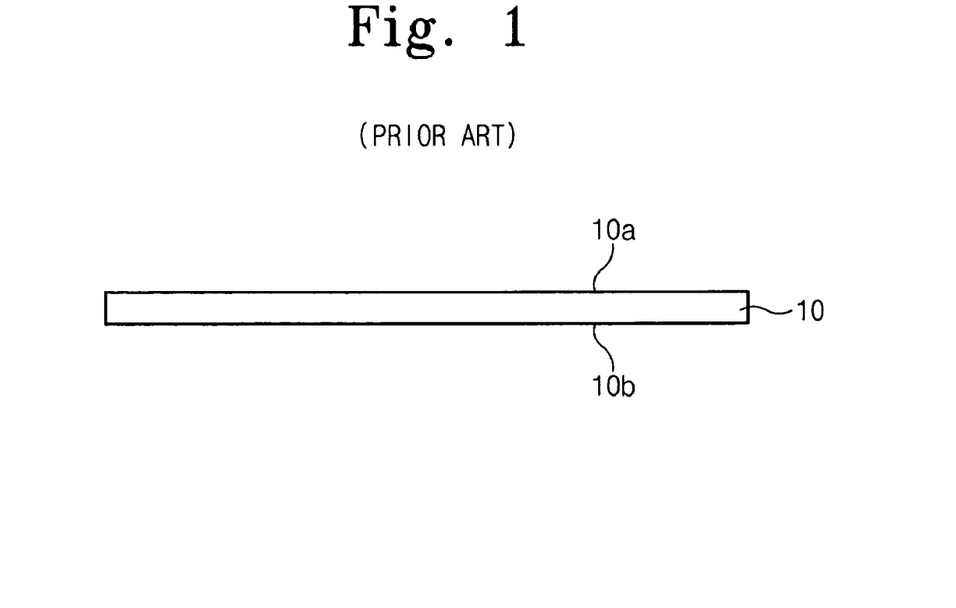
FIG. 1 and FIG. 2 illustrates process of fabricating semiconductor devices according to the prior art.
Figure 2:
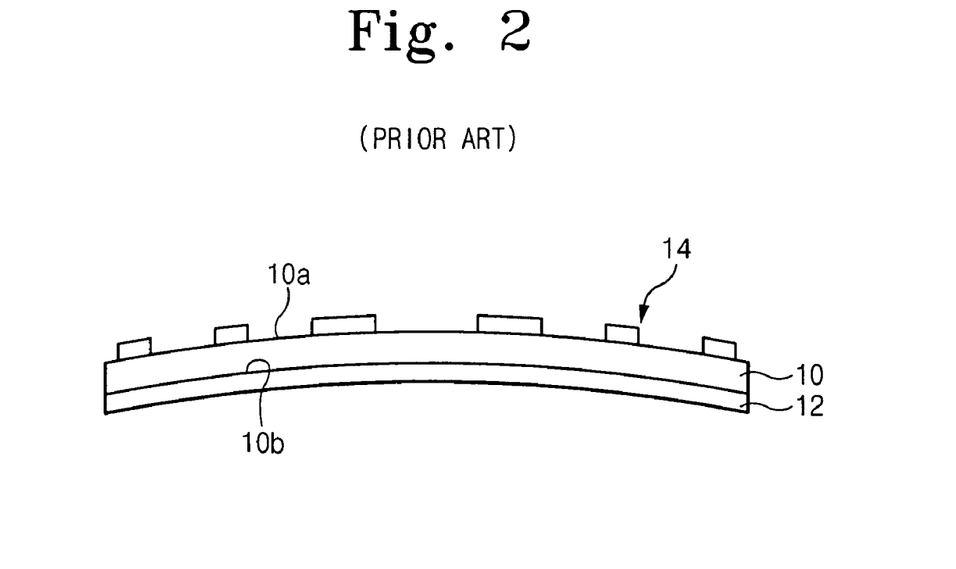

FIG. 1 and FIG. 2 are fabrication processes for illustrating a method for fabricating semiconductor devices according to the prior art.

Referring to FIG. 1, a semiconductor substrate 10 having a front side 10a and a back side 10b is prepared. Semiconductor devices are formed on the front side 10a of the semiconductor substrate 10. The semiconductor devices may be formed on a silicon substrate, a silicon germanium substrate, a SOI substrate, etc.

Referring to FIG. 2, at least one material layer is formed on the semiconductor substrate. A predetermined structure 14 can be formed by selectively patterning the material layers on the front side 10a of the substrate 10. The material layers may include various types of materials, such as oxide, nitride and the like. The materials layers can be formed through various deposition processes. For example, the oxide layer may be formed by a thermal oxidation process. As the material layers are formed on the front side of the semiconductor substrate 10, similar material layers 12 can be formed on the back side of the semiconductor substrate. Accordingly, the stresses applied to the front and back sides may not be balanced if the predetermined structure 14 is formed by pattering material layers on the front side of the semiconductor substrate 10 without patterning the corresponding layers 12 on the back side of the semiconductor substrate 10. As a result and as shown in FIG. 2, warpage of the semiconductor substrate 10 may occur.

Increased warpage of the semiconductor substrate may reduce pattern uniformity of the semiconductor substrate. Yield may be decreased, and furthermore, the semiconductor substrate may be broken down.

These problems may be more prevalent in large diameter wafers, such as wafers having a 300 mm diameter or more. Such large diameter wafers may have increased warpage depending on tensile stress or compressive stress.

SUMMARY OF THE INVENTION

According to embodiments of the present invention, methods of fabricating a semiconductor device are provided. At least one layer may be formed on a first and a second side of a semiconductor substrate. Portions of the at least one layer may be removed on the first side of the semiconductor substrate to form a pattern of the at least one layer on the first side of the substrate while the at least one layer is maintained on the second side of the substrate. A capping layer can be formed on the pattern of the at least one layer on the first side of the substrate and on the at least one layer on the second side of the semiconductor substrate. The capping layer can be removed on the second side of the semiconductor substrate, thereby exposing the at least one layer on the second side of the substrate while maintaining the capping layer on the first side of the substrate. The at least one layer can be removed on the second side of the semiconductor substrate, while the capping layer and the pattern of the at least one layer is maintained on the first side of the semiconductor substrate. A portion of the capping layer can be removed on the first side of the semiconductor substrate.

According to embodiments of the present invention, methods of fabricating a semiconductor device can include forming one or more layers on a first side and a second side of a semiconductor substrate. The semiconductor substrate can be rotated about an axis substantially perpendicular to a major surface of the semiconductor substrate. An etching solution can be applied while the semiconductor substrate is rotating to remove a portion of the one or more layers on the second side of the semiconductor substrate while maintaining the one or more layers on the first side of the semiconductor substrate.

According to further embodiments of the present invention, methods for forming a memory device can include forming a gate insulating layer on a first side and a second side of a semiconductor substrate. A gate electrode layer can be formed on the gate insulating layer on the first and the second sides of the semiconductor substrate. A masking layer can be formed on the gate electrode layer on the first and the second sides of the semiconductor substrate. The gate insulating layer, the gate electrode layer and the masking layer can be patterned on the first side of the semiconductor substrate to form a gate pattern on the first side of the semiconductor substrate while maintaining the gate insulating layer and the masking layer on the second side of the substrate. A conductive layer can be formed on the gate pattern and on the first side of the substrate and on the masking layer on the second side of the substrate. The conductive layer can be removed on the second side of the semiconductor substrate thereby exposing the masking layer. The masking layer, the gate electrode layer and the gate insulating layer can be removed on the second side of the semiconductor substrate while the conductive layer and the gate pattern is maintained on the first side of the semiconductor substrate. A portion of the conductive layer can be removed on the first side of the semiconductor substrate to form contact pads between portions of the gate pattern.

According to further embodiments of the present invention, methods for fabricating a semiconductor device can include providing a semiconductor substrate including a front side and a back side. At least one material layer can be stacked on the front side and the back side of the semiconductor substrate. The material layer can be selectively etched on the front side of the semiconductor substrate to form a first structure. A capping layer covering the material layer can be formed of the back side of the semiconductor substrate and on the first structure on the front side of the semiconductor substrate. The semiconductor substrate can be rotated. An etching solution can be supplied on the back side of the semiconductor substrate while the semiconductor substrate is rotating to selectively remove the capping layer on the back side while maintaining the capping layer on the front side. The first structure can be protected through the capping layer while the material layer of the back side of the semiconductor substrate is removed. The capping layer can be patterned to form a second structure on the front side of the substrate.

DESCRIPTION OF THE EXEMPLARY EMBODIMENT

The present invention now will be described more fully hereinafter with reference to the accompanying drawings, in which typical embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the relative sizes and/or thicknesses of elements and/or layers may be exaggerated for clarity. When a layer is described as being on another layer or a semiconductor substrate, the layer may be directly on the other layer or semiconductor substrate, or other layers may be interposed therebetween. In contrast, when an element is referred to as being "directly on" another element, there are no intervening elements present. Like reference numerals in the drawings denote like members.

Figure 3:
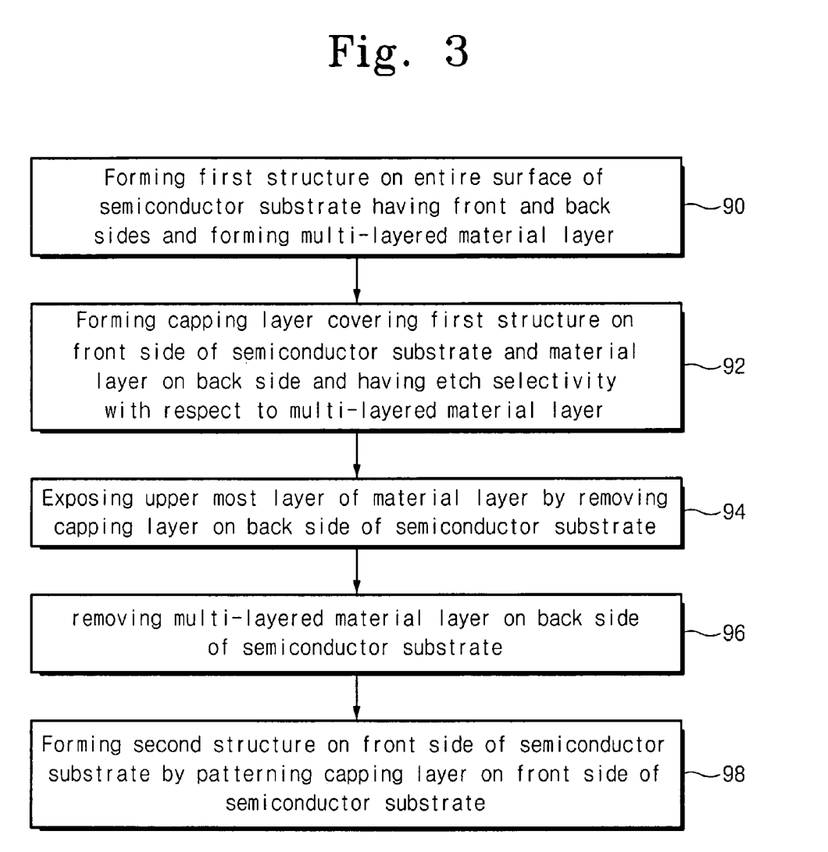
FIG. 3 is a flow chart illustrating operations for reducing wafer warpage according to embodiments of the present invention.
Figure 4:
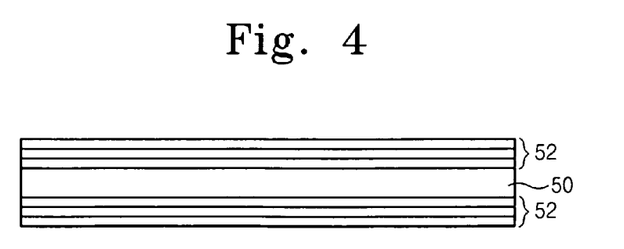
FIG. 4 to FIG. 8 are cross-sectional views illustrating steps of processing a semiconductor substrate for reducing wafer warpage when fabricating a DRAM according to a embodiments of the present invention.

Referring to FIG. 3 and FIG. 4, material layers 52 are formed on the front side and the back side of a semiconductor substrate 50 (Block 90 (FIG. 3)). The material layers 52 may be one or more layers, such as layers that can be used to form semiconductor devices, such as a DRAM device. The material layers 52 may be formed of materials having low etching selectivity with respect to each other, may be etched by the same chemical and/or may have a selectivity with respect to one another and/or another material formed in subsequent process. That is, the material layers 52 may be formed of one material or a combination of materials to form layers, such as a silicon oxide layer and/or a silicon nitride layer. The silicon oxide layer and the silicon nitride layer may have a low etching selectivity with respect to certain chemicals and a high etching selectivity with respect to another materials (e.g., polysilicon or the like used in process of fabricating semiconductor devices). The material layers 52 can be formed on a front side as well as a back side of the semiconductor substrate.

Figure 5:
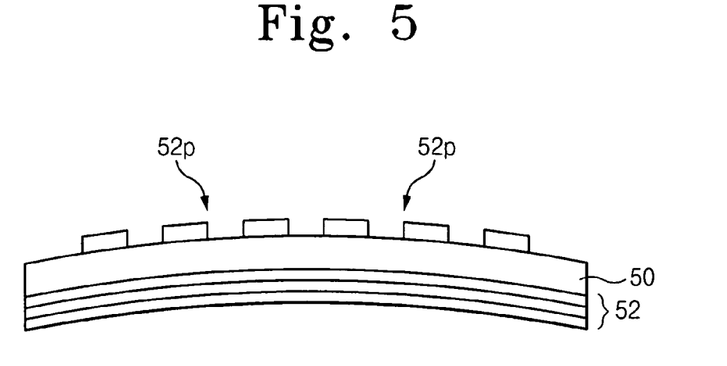

As shown in FIG. 5, a predetermined structure 52p can be formed by patterning the material layers 52 (of FIG. 4) on the front side of the semiconductor substrate 50. The material layers 52 can cover the back side of the semiconductor substrate 50 (Block 90 (FIG. 3)).

Figure 6:
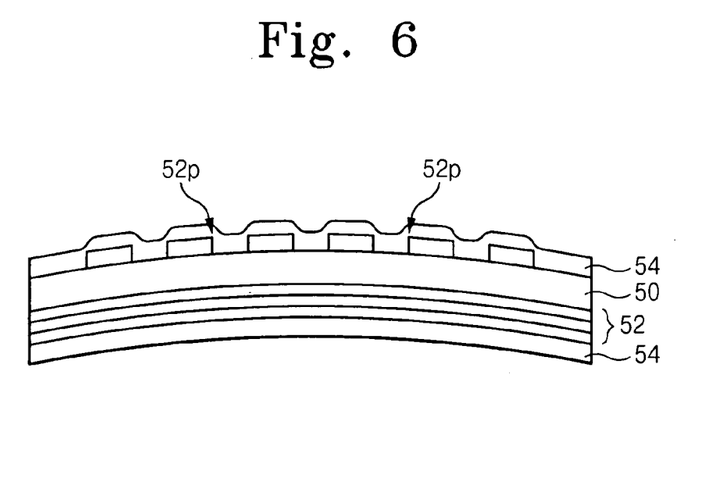

Referring FIG. 6, a capping layer 54 can be formed on both sides of the substrate 50. The capping layer 54 can cover the structure 52p on the front side of the semiconductor substrate and the material layer 54 of the back side of the semiconductor substrate (Block 92 (FIG. 3)). The capping layer 54 may have an etching selectivity with respect to the material layers 52 and may be selected from layers formed in one or more processing steps for fabricating devices. That is, embodiments of the present invention can incorporate materials having an etching selectivity with respect to the other materials on the semiconductor substrate, and the capping layer 54 can be subsequently etched so that a portion of the capping layer becomes a part of the semiconductor devices formed on the front side of the semiconductor substrate. Additional capping layer may not be needed to protect the structure 52p.

When the material layer includes one layer or a combination of layers, such as a silicon oxide layer and/or a silicon nitride layer, the capping layer 54 may be a polysilicon layer used in conductive portions of semiconductor devices.

Figure 7:
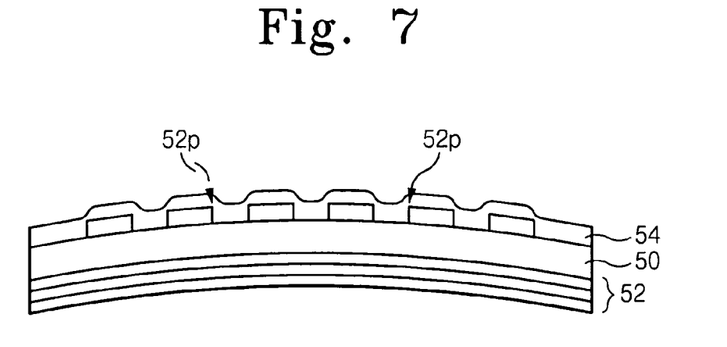

Referring to FIG. 7, the capping layer 54 on the back side may be selectively removed to expose an upper most layer of the material layers 52 on the back side (Block 94 (FIG. 3)). As illustrated, the capping layer 54 on the front side of semiconductor substrate 50 can be maintained during this step. For example, the front side of semiconductor substrate 50 can be rotated about an axis substantially perpendicular to the major surface of the semiconductor substrate 50 to protect the front side of the semiconductor substrate 50 from the etching solution while removing the capping layer 54 on the back side of the semiconductor substrate 50. For example, if the capping layer 54 is formed from polysilicon, the capping layer 54 can be removed by jetting a solution of $HNO_3$ and HF on the back side of the semiconductor substrate. In this case, ratio of $HNO_3$ may be he same or higher than that of HF (e.g., 1:1 to 500:1).

Figure 8:
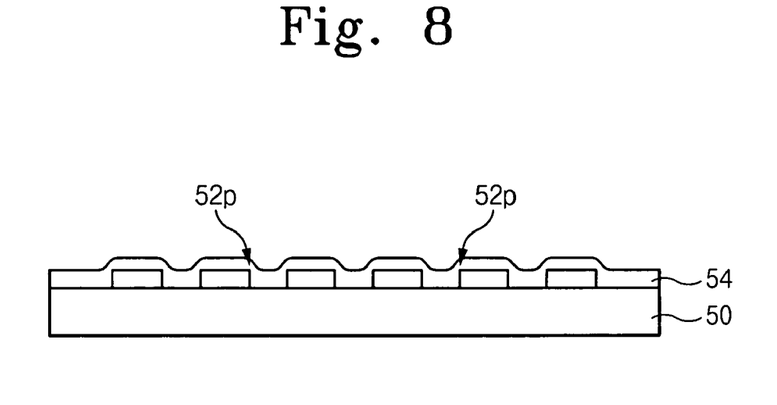

Referring to FIG. 8, the material layers 52 on the back side of the semiconductor substrate 50 can be removed (Block 96 (FIG. 3)). The material layers 52 can be removed by the application of an etching solution, such as an etching solution having an excellent etching selectivity with respect to the material layers 52 that does not react with the capping layer 54. Thus, the structure 52p on the front side of the semiconductor substrate 50 may be protected by the capping layer 54. Therefore, the material layers 52 can be removed by performing a wet etching process. This may reduce processing time. That is, the material layers 52 can be removed by bathing the semiconductor substrate 50 in an bath including a solution of HF and deionized water. Mixture ratios of HF and deionized water may be about 100:1 to 1:1.

In some embodiments, the capping layer 54 is not an additional material added to the fabrication steps, but rather a material used in an existing process for fabricating semiconductor devices. Accordingly, a second structure may be formed by patterning the capping layer 54 on the front side of semiconductor substrate after removing the material layers 52 from the back side (Block 98 (FIG. 3)). For example, the capping layer 54 can be used to form conductive portions of the device, such as contact pads for a DRAM device.

Figure 9:
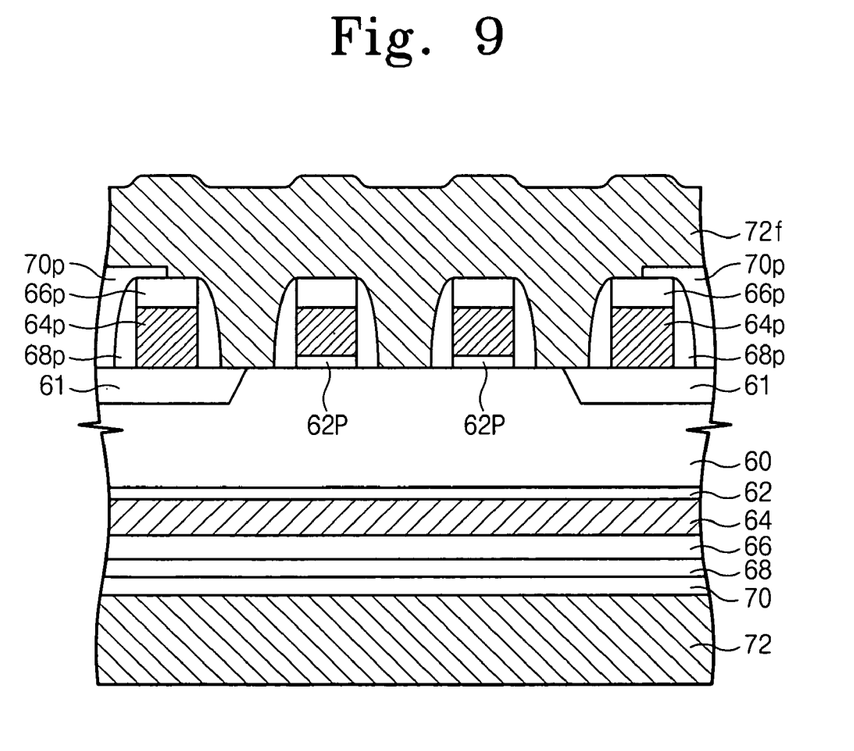
FIG. 9 to FIG. 11 are cross-sectional views illustrating steps of processing a semiconductor substrate for reducing wafer warpage when fabricating a DRAM according to embodiments of the present invention.

Referring to FIG. 9, in a process for fabricating a DRAM, a plurality of active regions can be defined by forming isolation layers 61 on the semiconductor substrate 60, and a plurality of parallel word lines 64p (i.e., gate electrodes) can be formed crossing over the active regions. Prior to forming the word lines 64p, a gate insulating layer 62p can be formed between the substrate 60 and the word lines 64p. A mask layer 66p can be formed on top of the word lines 64p, and sidewall spacers 68p can be formed on the sidewalls of the word lines 64p. The word lines 64p can be formed by etching a gate electrode layer, such as a polysilicon layer or a polycide layer. The mask layer 66p, and sidewall spacers 68p can be formed by etching respective layers, such as nitride layers. An interlayer dielectric layer 70 can be formed on the entire semiconductor substrate. The interlayer dielectric layer 70 is then patterned to form an interlayer dielectric layer 70p to expose a portion of the active region between the word lines. A conductive polysilicon layer 72, 72f can be formed on entire surface of the semiconductor substrate 60.

The first insulation layer 62, the first polysilicon layer 64, the second insulation layer 66, the third insulation layer 68, the interlayer dielectric layer 70 and the conductive layer 72 (e.g., a second polysilicon layer) can thus be formed on the back side of the semiconductor substrate 60 as illustrated in FIG. 9. The first polysilicon layer 64 and the conductive layer 72 can be formed while forming the word lines 64p and the front conductive layer 72f, respectively. The first insulation layer 62, the first polysilicon layer 64, the second insulation layer 66, the third insulation layer 68, and the interlayer dielectric layer 70 can be formed while forming the gate insulating layer 62p, the word lines 64p, the mask layer 66p, the sidewall spacers 68p and the interlayer dielectric layer 70p. As illustrated, the polysilicon conductive layer 72f on the front of the semiconductor substrate can be formed for patterning a conductive pad in the process of fabricating a DRAM device. The polysilicon conductive layer 72, 72f provides a capping layer. Thus, the polysilicon conductive layer 72 covers interlayer dielectric layer 70 on the back side of the semiconductor substrate 60. One or more of the insulating layers 62, 66, 68, and 70 can be formed from silicon nitride. Generally, silicon nitride layers in a multi-layered configuration may produce strong stresses on the semiconductor substrate. Accordingly, warpage of the semiconductor substrate can be reduced through removing silicon nitride layers to balance the stresses. Warpage can also be reduced by providing a capping layer, such as the polysilicon conductive layer 72, on the back side of the substrate 60.

Figure 10:
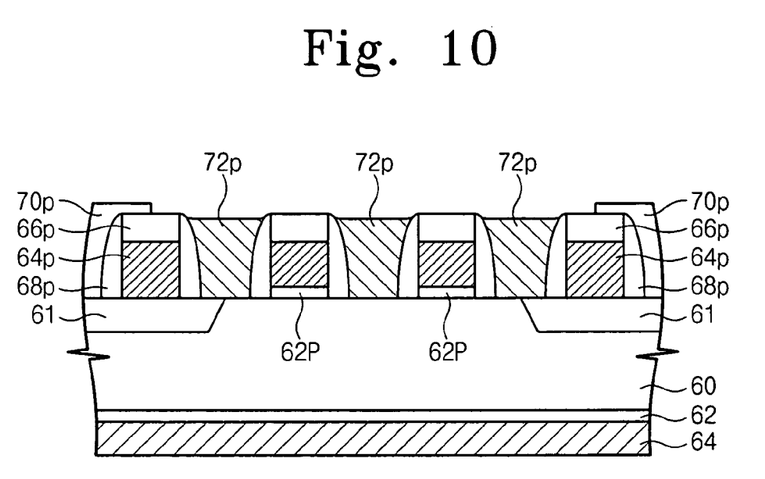

Referring to FIG. 10, the polysilcon conductive layer 72 on the back side of the semiconductor substrate 60 is removed. The conductive layer 72 may be removed by jetting a solution of HNO₃ and HF to the back side of the semiconductor substrate 60 while rotating the semiconductor substrate 60. In this case, the solution remains substantially on the back side of the semiconductor substrate 60 without removing layers from the front side due to centrifugal force pushing the solution away from the outer edge of the semiconductor substrate 60. Thus, the front side of semiconductor substrate 60 can be protected from the etching solution. However, in some embodiments, a protective material, such as a fluid, can be provided to the front side of the semiconductor substrate 60 to protect the front side from etching materials. For example, deionized water and/or inert gases may be jetted onto the front side of semiconductor substrate 60.

Thus, the interlayer dielectric layer 70 of FIG. 9 may be exposed on the back side of the semiconductor substrate after the conductive layer 72 is removed, and the conductive polysilicon layer 72f may cover the front side of the semiconductor substrate. Accordingly, the second insulation layer 66, the third insulation layer 68, and the fourth insulating layer 70 on the back side of the semiconductor substrate may be removed by performing a wet etching process on the semiconductor substrate 60.

The conductive layer 72f on the front side of the semiconductor substrate 60 can be recessed to form a plurality of conductive pads 72p in contact with active regions of the substrate 60.

Figure 11:
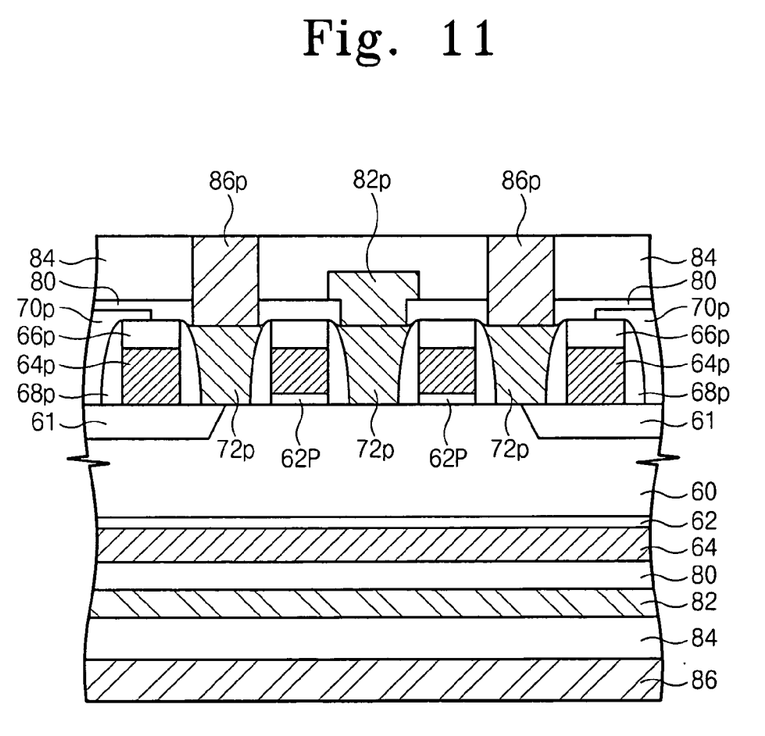

Referring to FIG. 11, an interlayer dielectric layer 80, an interlayer dielectric layer 84, a bit line 82p and a buried contact plug 86p can be formed on the semiconductor substrate 60. Materials 82 and 86 can be formed on the interlayer dielectric layer 80 and the interlayer dielectric layer 84, respectively, on the back side of the substrate 60. The bit line 82p and the buried contact plugs 86p can be sequentially stacked on the back side of the semiconductor substrate. Material layers of the back side of the semiconductor substrate may be further removed as desired. However, warpage of the semiconductor substrate 60 may be reduced in a subsequent process that removes a portion of one or more of the layers.

Figure 12:
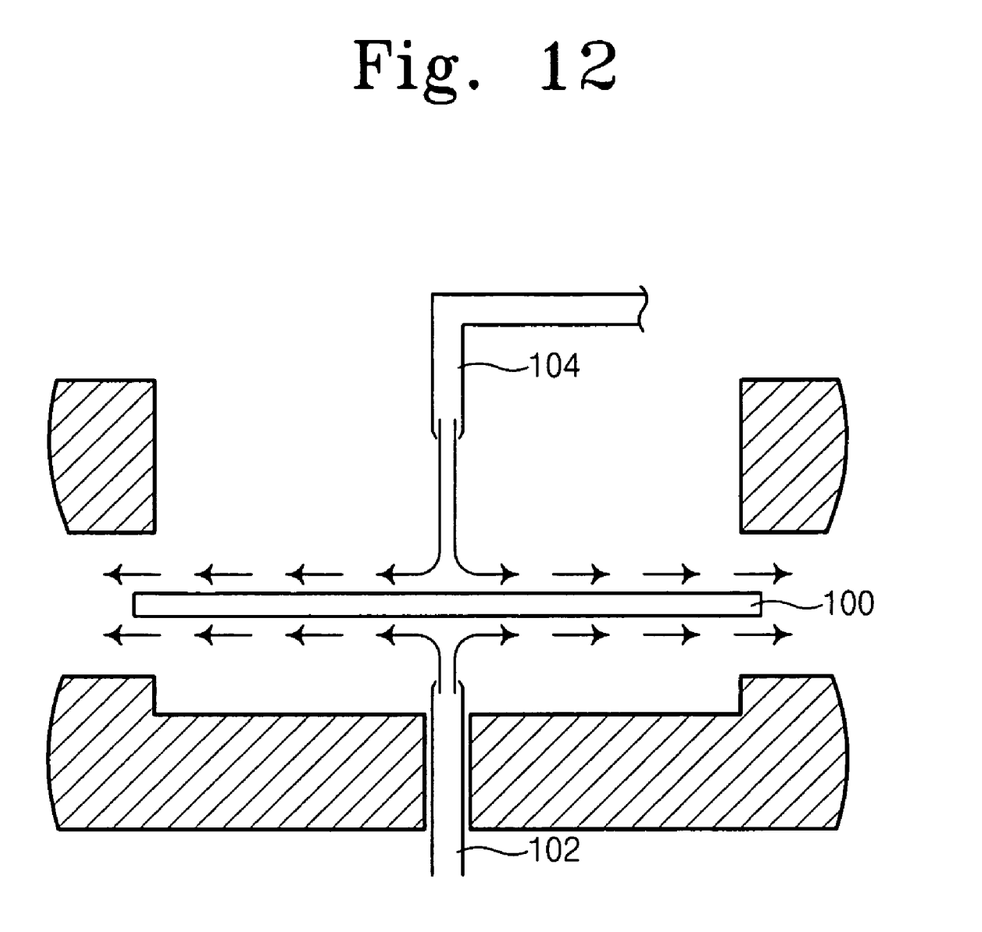
FIG. 12 illustrates a method and apparatus for etching a back side of wafer for reducing wafer warpage according to embodiments of the present invention.

FIG. 12 illustrates an apparatus and process for etching the back side of the semiconductor substrate according to embodiments of the present invention. Rotation equipment (not shown) and jetting equipment may be used to reduce warpage of a semiconductor substrate 100 by etching the back side of the semiconductor substrate 100. The rotation equipment can rotate the semiconductor substrate about an axis perpendicular to its major surface, and the jetting equipment can jet fluid to an area substantially in the center of the semiconductor substrate 100. The jetting equipment can include a first jetting apparatus 104 and a second jetting apparatus 102. The first jetting apparatus 104 can be positioned over the semiconductor substrate 100 and can jet fluid to the front side of the substrate 100 and the second jetting apparatus 102 can jet fluid to the back side of the substrate.

A structure or pattern may be formed of material layers on the front side of the semiconductor substrate 100. Steps used to form the structure or pattern can apply stress to the semiconductor substrate 100. A capping layer can be formed on the substrate 100 and subsequently used to form another structure or pattern. Generally, one or more layers used to form the structure on the front side may also be stacked on the back side of the semiconductor substrate 100. The capping layer can be stacked on the material layer. For example, the semiconductor substrate may be rotated, and an etching solution for etching the capping layer can be jetted to the back side of the semiconductor substrate 100. If the etching solution is jetted to the back side of a stationary semiconductor substrate 100, etching uniformity may be decreased. In addition, if the etching solution is conformally jetted to the entire back side of the semiconductor substrate 100, the etching solution may contact the front side of the semiconductor substrate 100. In some embodiments, the etching solution can be jetted to the semiconductor substrate 100 while the substrate 100 is rotating. Thus, the etching solution may be substantially prevented from contacting the front side of the semiconductor substrate 100 because of centrifugal force in the direction away from the edge of the semiconductor substrate 100. Therefore, the front side of the semiconductor substrate 100 can be protected from the etching solution. Furthermore, the front side of the semiconductor substrate 100 may be protected by jetting a protective material to the front side of the semiconductor substrate 100 to protect the front side from traces of etching solution. The protective material may be a fluid that does not react with the capping layers, such as deionized water or inert gases.

For example, the back side of the semiconductor substrate 100 may be arranged in the upper direction facing the first jetting apparatus 104. The first jetting apparatus 104 may apply the etching solution and the second jetting apparatus 102 may apply the protective material. In another example, if the back side of the semiconductor substrate 100 is arranged in the bottom direction facing the second jetting apparatus 102, the first jetting apparatus 104 can apply the protective material and the second jetting apparatus 102 can apply the etching solution.

After removing the capping layer, an upper layer of the material layers can be exposed on the back side of the substrate 100, and the front side of the substrate can be covered with the capping layer. Material layers of the back side of the semiconductor substrate can be subsequently removed by bathing in a solution. For example, a solution can be selected such that the solution has a low etching selectivity with respect to the capping layer so that the capping layer is not removed.

Figure 13:
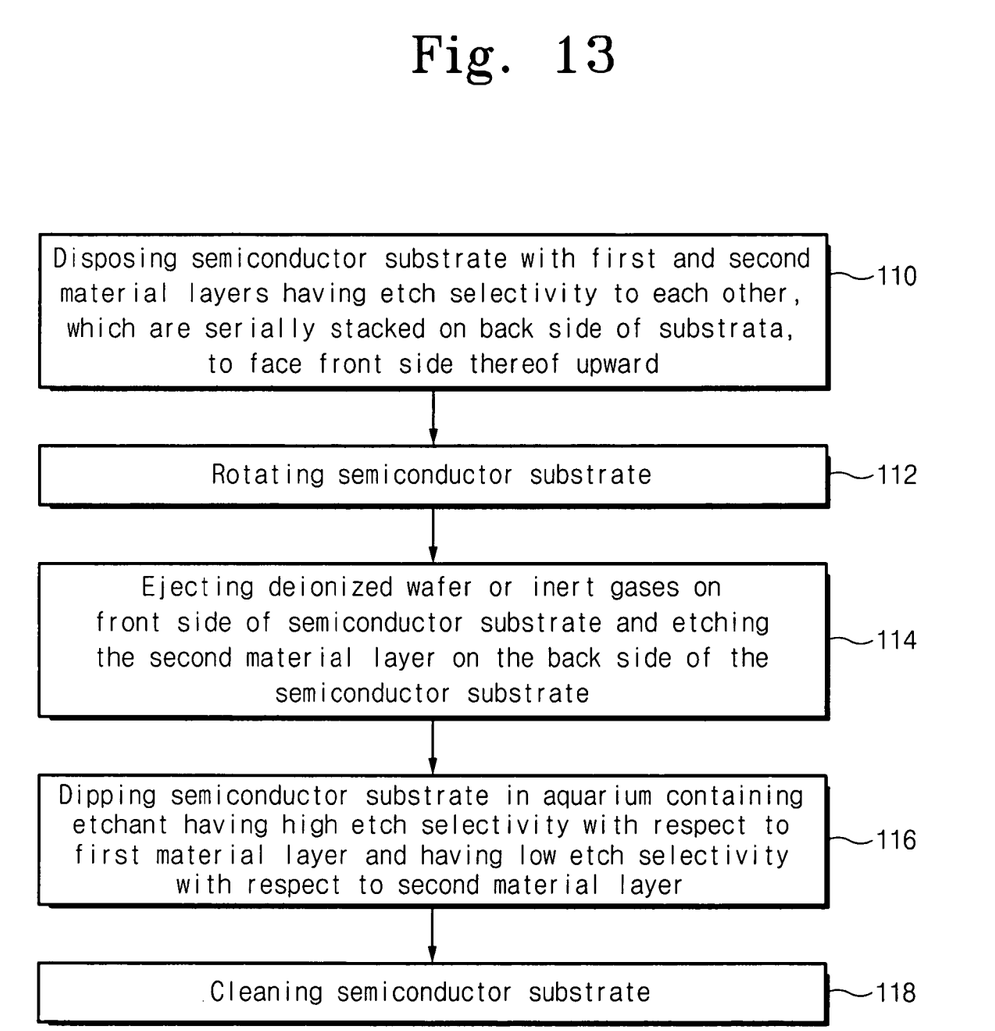
FIG. 13 to FIG. 15 are flow charts illustrating operations for etching the back side of a wafer for reducing wafer warpage according to embodiments of the present invention.
Figure 14:
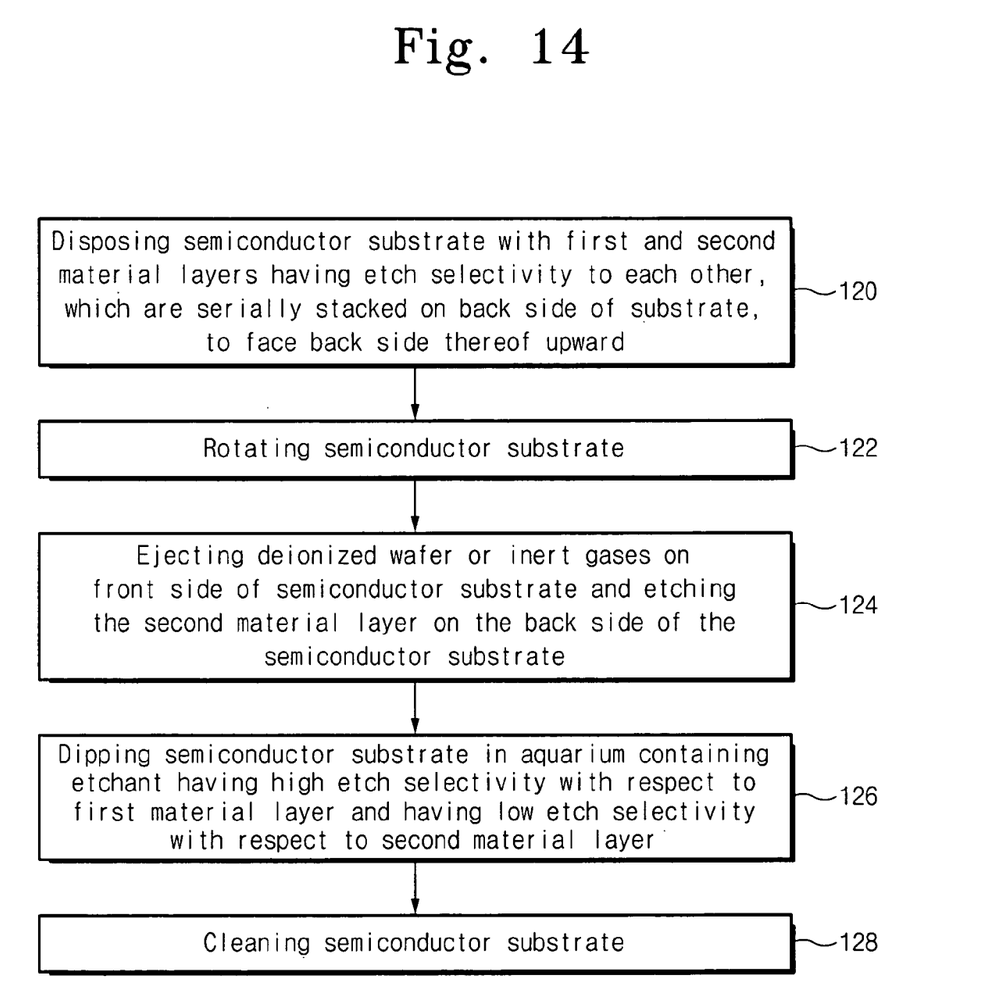
Figure 15:
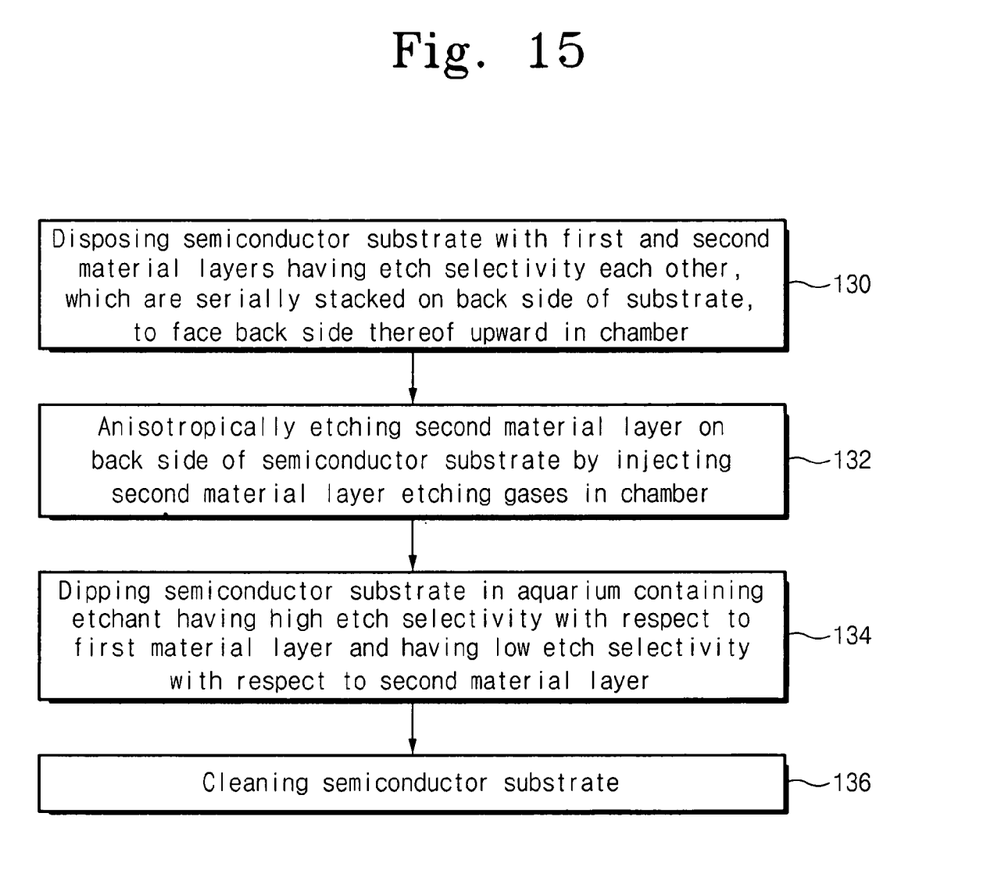

FIG. 13–FIG. 15 are flow charts for illustrating the method for etching the back side of the semiconductor substrate for reducing wafer warpage.

As shown in FIG. 13, the front side of the semiconductor substrate may be arranged in the upper direction. A first material layer and a second material layer can be sequentially stacked on the back side of the semiconductor substrate (Block 110).

The semiconductor substrate can be rotated about an axis perpendicular to the major surface of the substrate (Block 112). Fluids such as solutions and/or gases may be placed in contact with one surface of the semiconductor substrate and can be forced away from the other surface due to centrifugal force.

Deionized water or inert gases may be jetted on the front side of the semiconductor substrate, while the etching solution for etching the second material layer can be jetted on the back side of the semiconductor substrate (Block 114). In this case, the deionized water or inert gases may be jetted at an earlier time than the etching solution. Jetting of the etching solution may be terminated before jetting deionized water or inert gases.

The first material layer exposed on the back side of the semiconductor substrate may be etched by bathing the semiconductor substrate in an bath containing an etching solution having a high etching selectivity with respect to the first material layer (Block 116). The etching solution in the bath may not react with the second material layer or may have a significantly lower etching speed with respect to the second material layer.

The semiconductor substrate may be cleaned (Block 118). The first and second material layers of the back side of the semiconductor substrate may be removed. At the same time, a predetermined structure or pattern may be formed by pattering the second material layer on the front side of the semiconductor substrate.

As shown in FIG. 14, in some embodiments, the sides of the substrate may be reversed. Blocks 120, 122, 124, 126, and 128 in FIG. 14 correspond to Blocks 110, 112, 113, 116 and 118 discussed above.

In some embodiments, the second material layer may be removed by applying plasma etching methods. Referring to FIG. 15, the semiconductor substrate can be arranged in a chamber so that the back side of the semiconductor substrate is in the upper direction. The back side of the semiconductor substrate includes sequentially stacked first and second material layers having an etching selectivity to each other (Block 130).

The second material layer of the back side of the semiconductor substrate can be etched by injecting etching gases having high etching selectivity with respect to the second material layer in the chamber (Block 132). Etching gases may only etch the back side of the semiconductor substrate depending on the direction of plasma power.

The first material layer may be etched by bathing the semiconductor substrate in the etching solution having high etching selectivity with respect to the first material layer (Block 134).

The semiconductor substrate may be cleaned (Block 136). A predetermined structure or pattern can be formed by patterning the second material layer on the front side of the semiconductor substrate.

As previously discussed, wafer warpage can be reduced by removing at least a portion of a layer on the back side of the semiconductor substrate that increases wafer warpage. In this case, damage to the structure formed on the front side can be protected by etching the back side using a capping layer that covers the structure on the front side. The capping layer can be used in a subsequent processing step to form another pattern or structure component.

Furthermore, the front side of the semiconductor substrate can be protected from the etching solution that removes the capping layer by removing the capping layer of the back side of the semiconductor substrate while the substrate is rotated about an axis perpendicular to its major surface.

It should be noted that many variations and modifications might be made to the embodiments described above without substantially departing from the principles of the present invention. All such variations and modifications are intended to be included herein within the scope of the present invention, as set forth in the following claims.

What is claimed is:

1. A method of fabricating a semiconductor device comprising:

forming at least one layer on a first and a second side of a semiconductor substrate;

removing portions of the at least one layer on the first side of the semiconductor substrate to form a pattern of the at least one layer on the first side of the substrate while maintaining the at least one layer on the second side of the substrate;

forming a capping layer on the pattern of the at least one layer on the first side of the substrate and on the at least one layer on the second side of the semiconductor substrate;

removing the capping layer on the second side of the semiconductor substrate thereby exposing the at least one layer on the second side of the substrate while maintaining the capping layer on the first side of the substrate;

removing the at least one layer on the second side of the semiconductor substrate, while maintaining the capping layer and the pattern of the at least one layer on the first side of the semiconductor substrate; and removing a portion of the capping layer on the first side of the semiconductor substrate wherein the capping layer is formed of a material that is different from the at least one layer on the second side of the substrate.

2. The method of claim 1 wherein removing the capping layer on the second side of the semiconductor substrate further comprises applying an etching solution to the second side of the semiconductor substrate while applying a protective material to the first side of the semiconductor substrate to protect the first side from the etching solution.

3. The method of claim 2, wherein removing the capping layer on the second side of the semiconductor substrate further comprises rotating the semiconductor substrate about an axis substantially perpendicular to a major surface of the semiconductor substrate while applying the etching solution.

4. The method of claim 2, wherein the protective material comprises a fluid.

5. The method of claim 2, wherein the protective material comprises deionized water.

6. The method of claim 2, wherein the protective material comprises an inert gas.

7. The method of claim 1, further comprising etching the capping layer to form a contact pad.

8. The method of claim 1, wherein removing a portion of the at least one layer on the first side comprises selectively etching a portion of the at least one layer to form a semiconductor structure on the first side of the semiconductor substrate.

9. The method of claim 1, wherein removing the capping layer on the second side of the semiconductor substrate comprises removing the capping layer on substantially the entire second side of the semiconductor substrate.

10. The method of claim 1, wherein removing the at least one layer on the second side of the semiconductor substrate comprises removing the at least one layer on substantially the entire second side of the semiconductor substrate.

11. A method of fabricating a semiconductor device comprising:

forming at least one layer on a first and a second side of a semiconductor substrate;

removing portions of the at least one layer on the first side of the semiconductor substrate to form a pattern of the at least one layer on the first side of the substrate while maintaining the at least one layer on the second side of the substrate;

forming a capping layer on the pattern of the at least one layer on the first side of the substrate and on the at least one layer on the second side of the semiconductor substrate;

removing the capping layer on the second side of the semiconductor substrate thereby exposing the at least one layer on the second side of the substrate while maintaining the capping layer on the first side of the substrate;

removing the at least one layer on the second side of the semiconductor substrate, while maintaining the capping layer and the pattern of the at least one layer on the first side of the semiconductor substrate; and removing a portion of the capping layer on the first side of the semiconductor substrate, wherein removing the at least one layer on the second side of the semiconductor substrate precedes removing a portion of the capping layer on the first side of the semiconductor substrate.

12. The method of claim 11, wherein removing portions of the at least one layer on the first side of the semiconductor substrate to form a pattern of the at least one layer precedes forming a capping layer on the pattern of the at least one layer.

13. A method for forming a memory device comprising:

forming a gate insulating layer on a first side and a second side of a semiconductor substrate;

forming a gate electrode layer on the gate insulating layer on the first and the second sides of the semiconductor substrate;

forming a masking layer on the gate electrode layer on the first and the second sides of the semiconductor substrate;

patterning the gate insulating layer, the gate electrode layer and the masking layer on the first side of the semiconductor substrate to form a gate pattern on the first side of the semiconductor substrate while maintaining the gate insulating layer, the gate electrode layer, and the masking layer on the second side of the semiconductor substrate;

forming a conductive layer on the gate pattern and on the first side of the substrate and on the masking layer on the second side of the semiconductor substrate;

removing the conductive layer on the second side of the semiconductor substrate thereby exposing the masking layer;

removing the masking layer, the gate electrode layer, and the gate insulating layer on the second side of the semiconductor substrate while maintaining the conductive layer and the gate pattern on the first side of the semiconductor substrate; and removing a portion of the conductive layer on the first side of the semiconductor substrate to form contact pads between portions of the gate pattern.

14. A method according to claim 1, wherein the pattern of the at least one layer on the first side of the substrate includes sidewalls, and the capping layer is formed on the sidewalls of the pattern.

* * * * *